United States Patent
Murao et al.

(10) Patent No.: US 10,361,693 B2
(45) Date of Patent: Jul. 23, 2019

(54) POWER SOURCE SUPPLY CIRCUIT, AMPLIFIER, COMMUNICATION DEVICE, BASE STATION, AND POWER SOURCE SUPPLY METHOD

(71) Applicant: NEC Corporation, Tokyo (JP)

(72) Inventors: Yoji Murao, Tokyo (JP); Kazumi Shiikuma, Tokyo (JP)

(73) Assignee: NEC CORPORATION, Minato-ku, Tokyo (JP)

( * ) Notice: Subject to any disclaimer, the term of this patent is extended or adjusted under 35 U.S.C. 154(b) by 33 days.

(21) Appl. No.: 15/548,438

(22) PCT Filed: Jan. 5, 2016

(86) PCT No.: PCT/JP2016/000017
§ 371 (c)(1),
(2) Date: Aug. 3, 2017

(87) PCT Pub. No.: WO2016/125424
PCT Pub. Date: Aug. 11, 2016

(65) Prior Publication Data
US 2018/0026619 A1    Jan. 25, 2018

(30) Foreign Application Priority Data
Feb. 6, 2015 (JP) ................................ 2015-022141

(51) Int. Cl.
*H03K 17/04* (2006.01)
*H04B 1/04* (2006.01)
(Continued)

(52) U.S. Cl.
CPC ............ *H03K 17/04* (2013.01); *H03F 1/523* (2013.01); *H03F 1/56* (2013.01); *H03F 3/193* (2013.01);
(Continued)

(58) Field of Classification Search
None
See application file for complete search history.

(56) References Cited

U.S. PATENT DOCUMENTS

| 6,118,989 A | 9/2000 | Abe et al. |
| 2003/0128485 A1* | 7/2003 | Matsumoto ............. H02H 3/06 361/18 |

(Continued)

FOREIGN PATENT DOCUMENTS

| JP | 10-173453 A | 6/1998 |
| JP | 2009-272914 A | 11/2009 |

(Continued)

OTHER PUBLICATIONS

3GPP TS 36.104, V12.5.0 (Sep. 2014), Technical Specification, 3rd Generation Partnership Project; Technical Specification Group Radio Access Network; Evolved Universal Terrestrial Radio Access (E-UTRA); Base Station (BS) radio transmission and reception (Release 12), 2004, 152 pages.

(Continued)

*Primary Examiner* — Diane L Lo
(74) *Attorney, Agent, or Firm* — Sughrue Mion, PLLC (57) ABSTRACT

A power source supply circuit includes: a plurality of power sources (11-1, 11-2) that generate power source voltages different from each other; a switch circuit (14) that switches and outputs the power source voltages generated in the plurality of power sources (11-1, 11-2); a voltage output terminal (16) that outputs outside the power source voltages output from the switch circuit (14); an RF choke circuit (15) provided between the switch circuit (14) and the voltage output terminal (16), the RF choke circuit (15) including a first capacitor; and a second capacitor (12-1, 12-2) provided between the plurality of power sources (11-1, 11-2) and the (Continued)

switch circuit (14), the second capacitor (12-1, 12-2) having a larger capacitance than the first capacitor.

15 Claims, 8 Drawing Sheets

(51) Int. Cl.
| | |
|---|---|
| H04B 1/40 | (2015.01) |
| H03F 1/52 | (2006.01) |
| H03F 1/56 | (2006.01) |
| H03F 3/193 | (2006.01) |
| H04B 1/44 | (2006.01) |
| H04W 88/08 | (2009.01) |
| H03F 3/24 | (2006.01) |
| H03F 3/60 | (2006.01) |
| H04B 1/525 | (2015.01) |
| H04B 15/00 | (2006.01) |
| H04L 5/14 | (2006.01) |

(52) U.S. Cl.
CPC ............ *H03F 3/245* (2013.01); *H03F 3/601* (2013.01); *H04B 1/04* (2013.01); *H04B 1/0475* (2013.01); *H04B 1/40* (2013.01); *H04B 1/44* (2013.01); *H04B 1/525* (2013.01); *H04B 15/005* (2013.01); *H04W 88/08* (2013.01); *H03F 2200/12* (2013.01); *H03F 2200/255* (2013.01); *H03F 2200/423* (2013.01); *H04L 5/1461* (2013.01)

(56) References Cited

U.S. PATENT DOCUMENTS

| | | | | |
|---|---|---|---|---|
| 2007/0229168 | A1* | 10/2007 | Ma | H03H 7/075 330/297 |
| 2009/0184582 | A1* | 7/2009 | Hwang | H02M 1/10 307/64 |
| 2009/0327558 | A1* | 12/2009 | Landry | G06F 13/4072 710/301 |
| 2012/0098602 | A1 | 4/2012 | Doi | |

FOREIGN PATENT DOCUMENTS

| | | |
|---|---|---|
| JP | 2010-103796 A | 5/2010 |
| JP | 2011-097638 A | 5/2011 |
| JP | 2012-049676 A | 3/2012 |
| JP | 2013-9200 A | 1/2013 |
| WO | 2011/002099 A1 | 1/2011 |

OTHER PUBLICATIONS

International Search Report of PCT/JP2016/000017 dated Mar. 1, 2016.

Decision to Grant a Patent dated Oct. 16, 2018 issued by the Japanese Patent Office in counterpart application No. 2016-573211.

* cited by examiner

EQUIVALENT DELAY
CIRCUIT OF THE
EMBODIMENT

Fig. 4

EQUIVALENT DELAY
CIRCUIT OF RELATED
ART

POWER SOURCE SUPPLY CIRCUIT, AMPLIFIER, COMMUNICATION DEVICE, BASE STATION, AND POWER SOURCE SUPPLY METHOD

CROSS REFERENCE TO RELATED APPLICATIONS

This application is a National Stage of International Application No. PCT/JP2016/000017 filed Jan. 5, 2016, claiming priority based on Japanese Patent Application No. 2015-022141 filed Feb. 6, 2015, the contents of all of which are incorporated herein by reference in their entirety.

TECHNICAL FIELD

The present invention relates to a power source supply circuit, an amplifier, a communication device, a base station, and a power source supply method.

BACKGROUND ART

As a communication scheme of mobile broadband communication, there is a TDD (Time Domain Duplexing) scheme that switches uplink and downlink communication to high speeds using the same frequency band in the uplink and downlink communication. For example, a switching time of transmission/reception of a base station is prescribed in LTE (Long Term Evolution) that is a high-speed communication standard. According to this prescription, the base station needs to shorten a switching time of transmission/reception to not more than 17 μs (Non Patent Literature 1).

In addition, in a communication device of the TDD scheme, it is necessary to suppress noise that sneaks in a reception system from a transmission system during a reception period in order to improve reception sensitivity of the reception system. Therefore, control may be performed to cut off power source supply to an amplifier of the transmission system during the reception period. In addition, since an envelope of a signal has a broadband frequency component particularly in a communication device that deals with a complex multi-level digital modulation wave among communication devices of LTE, a voltage needs to be stabilized so that a bias circuit, such as the amplifier, does not fluctuate. Therefore, it is general that decoupling of the bias circuit is performed in a broadband (it may be generally called a video band in many cases) ranging from a DC band to several 100 MHz bands. For example, in the amplifier of the transmission system of the base station, a decoupling capacitor having a μF-class capacitance (approximately 0.1 to 50 μF) is connected in the vicinity of an amplifying transistor and the bias circuit for the purpose of decoupling. Note that the amplifying transistor includes an FET (Field Effect Transistor) etc. Accordingly, in a case of controlling power source supply to the amplifying transistor of the amplifier of the transmission system, charge and discharge to the decoupling capacitor is needed. For example, in a case of providing the decoupling capacitor near a gate terminal of the amplifying transistor, it may be considered to connect a discharging resistor in parallel with the decoupling capacitor. However, since the discharging resistor has a resistance value of approximately several kΩ, charges of the decoupling capacitor cannot be discharged at high speed only by the discharging resistor, in a case of turning off a gate voltage to the amplifying transistor. For this reason, a charge and discharge time to the decoupling capacitor may be long and, for example, may be a time of μs or more in some cases. Therefore, it is difficult in many cases to use the transistor in the vicinity of which the decoupling capacitor is connected for applications requiring high-speed ON/OFF of the transistor.

Patent Literature 1 is an example of a technology for realizing high-speed ON/OFF of the transistor. Patent Literature 1 discloses a configuration in which a circuit is formed by a capacitor (0.1 μF in an example in the specification of Patent Literature 1) provided close to a gate terminal of an amplifying transistor, and a discharging resistor provided in parallel with the capacitor, the circuit having a time constant at the time of discharge, and having a switch element in order to discharge charges of the capacitor at high speed. In Patent Literature 1, charge and discharge to the capacitor provided close to the gate terminal of the amplifying transistor is performed by charges that pass through the switch element, the capacitor having a comparatively large capacitance, and thereby ON/OFF of the amplifying transistor is switched. Therefore, it is possible to achieve more shortening of a switching time of ON/OFF of the amplifying transistor than the time constant of discharge by the discharging resistor. However, since essentially, a configuration is employed in which charge and discharge of the capacitor having large capacitance are performed, there is a problem that it is difficult to achieve further shortening of the switching time.

Patent Literature 2 is an example of a technology controlling a gate bias of a transistor by a switch. Patent Literature 2 discloses a variable gain amplifier in which a source-grounded type amplifier and a gate-grounded type amplifier are cascode-connected. In the variable gain amplifier of Patent Literature 2, in order to make gains of all the amplifiers variable, gate biases of the plurality of source-grounded type amplifiers provided in an initial stage are selectively turned on and off, and thereby an operating point of the gate-grounded type amplifier provided in a subsequent stage is changed. In addition, Patent Literature 2 describes one example of a configuration of switches to selectively turn on and off the gate biases of the plurality of source-grounded amplifiers of the initial stage and the plurality of gate-grounded type amplifiers provided in the subsequent stage, and a technology to suppress an output impedance and load fluctuations while selectively varying gains, the output impedance and the load fluctuations being caused at the time of selectively varying the gains. However, Patent Literature 2 neither specifically describes nor suggests a configuration for switching of the gate biases at high speed.

Patent Literature 3 discloses a technology in which, in a bias circuit of an amplifying transistor, by parallel operation of a switch circuit, a supply current capability and a discharge current capability per unit time are expanded, and a switching time of ON/OFF of the amplifying transistor is reduced. However, in Patent Literature 3, there is a problem that in a case where the number of switch circuits is n, a circuit scale becomes n times larger, although the switching time can be shortened almost to a 1/n time.

CITATION LIST

Patent Literature

Patent Literature 1
  International Patent Publication No. WO2011/002099
Patent Literature 2
  Japanese Unexamined Patent Application Publication No. 2011-97638

Patent Literature 3
  Japanese Unexamined Patent Application Publication No. 2012-49676

Non Patent Literature

Non Patent Literature 1
  3GPP TS 36.104 V12.5.0 (2014-09)

SUMMARY OF INVENTION

Technical Problem

As mentioned above, in Patent Literature 1, there is a problem that it is difficult to achieve a further increase in speed of ON/OFF of the transistor. In addition, in Patent Literature 2, there is neither described nor suggested a configuration to perform switching of the gate biases of the transistor at high speed. In addition, in Patent Literature 3, there is a problem that the circuit scale has to become large in order to achieve an increase in speed of ON/OFF of the transistor.

Consequently, one object of the present invention is to provide a power source supply circuit, an amplifier, a communication device, a base station, and a power source supply method that can solve the above-mentioned problems and can achieve a further increase in speed of ON/OFF of a transistor without increasing a circuit scale.

Solution to Problem

In one aspect, a power source supply circuit includes: a plurality of first power sources that generate power source voltages different from each other; a switch circuit that switches and outputs the power source voltages generated by the plurality of first power sources; a voltage output terminal that outputs outside the power source voltages output from the switch circuit; an RF (Radio Frequency) choke circuit provided between the switch circuit and the voltage output terminal, the RF choke circuit including a first capacitor; and a second capacitor provided between the plurality of first power sources and the switch circuit, the second capacitor having a larger capacitance than the first capacitor.

In one aspect, an amplifier includes the power source supply circuit and an amplifying transistor, and the voltage output terminal of the power source supply circuit is connected to a gate terminal or a base terminal of the amplifying transistor.

In one aspect, a communication device includes the amplifier, and the amplifying transistor amplifies a transmission signal or a reception signal.

In one aspect, a base station is a base station of a TDD (Time Domain Duplexing) scheme. The base station includes: a plurality of first power sources that generate power source voltages different from each other; a switch circuit that switches and outputs the power source voltages generated by the plurality of first power sources; an RF choke circuit that includes a first capacitor connected to an output terminal of the switch circuit; a second capacitor provided between the plurality of first power sources and the switch circuit, the second capacitor having a larger capacitance than the first capacitor; and an amplifying transistor that operates by a power source voltage output from the RF choke circuit. The base station, at the time of transmission, amplifies a signal by the amplifying transistor, and transmits the amplified signal.

In one aspect, a power source supply method includes: generating power source voltages different from each other by a plurality of first power sources; switching by a switch circuit the power source voltages generated by the plurality of first power sources, and outputting them outside from a voltage output terminal; providing an RF choke circuit between the switch circuit and the voltage output terminal, the RF choke circuit including a first capacitor; and providing a second capacitor between the plurality of first power sources and the switch circuit, the second capacitor having a larger capacitance than the first capacitor.

Advantageous Effects of Invention

According to the above-mentioned aspects, there is obtained an effect capable of achieving further increase in speed of ON/OFF of the transistor without increasing the circuit scale.

DESCRIPTION OF EMBODIMENTS

Figure 1:
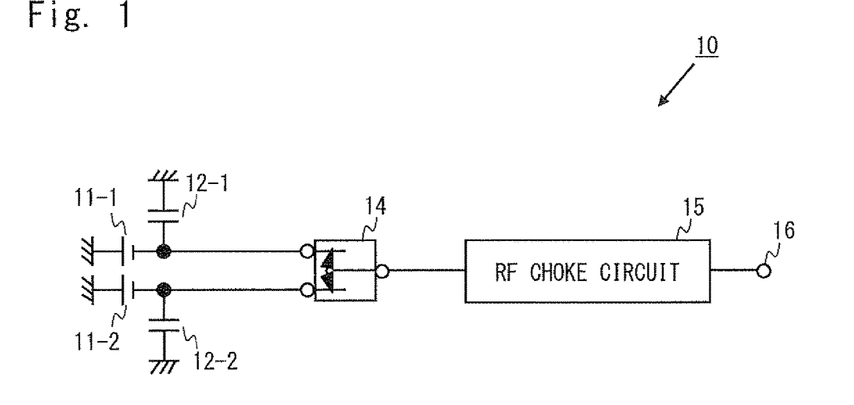
FIG. 1 is a diagram showing a configuration example of a power source supply circuit according to an embodiment 1.

Hereinafter, embodiments of the present invention will be explained with reference to drawings.
(1) Embodiment 1
  In FIG. 1, there is shown a configuration example of a power source supply circuit according to an embodiment 1. A power source supply circuit 10 shown in FIG. 1 includes: two power sources (first power sources) 11-1 and 11-2; two µF-class capacitors (second capacitors) 12-1 and 12-2; an SPDT (Single-Pole Double-Throw) type switch circuit 14; an RF (Radio Frequency) choke circuit 15; and a voltage output terminal 16. Note that although FIG. 1 is an example in which the two power sources 11-1 and 11-2 are used, the number of power sources is not limited to two, and may be three or more.

The power sources 11-1 and 11-2 generate power source voltages different from each other. The switch circuit 14 is an SPDT-type switch with a ratio of 2 to 1 to which the power source voltages generated by the two power sources 11-1 and 11-2 are input, and that switches and outputs these power source voltages. Specifically, the switch circuit 14 includes two input terminals connected respectively to the two power sources 11-1 and 11-2, and an output terminal connected to either of the two input terminals, and switches a connection destination of the output terminal to either of the two input terminals according to a switch changeover signal.

The voltage output terminal 16 outputs outside a power source voltage output from the switch circuit 14. The RF choke circuit 15 is provided between the switch circuit 14 and the voltage output terminal 16, and an impedance seen from the voltage output terminal 16 side is a high impedance in a frequency band of a high-frequency signal. In addition, the RF choke circuit 15 includes a high-frequency grounding capacitor (a first capacitor) having a capacitance of approximately 1 to 100 pF.

The µF-class capacitors 12-1 and 12-2 are provided to correspond to the power sources 11-1 and 11-2, and are connected in parallel between the corresponding power sources and the switch circuit 14. The µF-class capacitors 12-1 and 12-2 each have a capacitance of approximately 0.1 to 50 µF. Note that the µF-class capacitors 12-1 and 12-2 may have larger capacitances than that of the high-frequency grounding capacitor in the RF choke circuit 15, and may desirably have capacitances ten times as large as that of the high-frequency grounding capacitor has.

In the embodiment as mentioned above, the µF-class capacitors 12-1 and 12-2 are provided closer to the power sources 11-1 and 11-2 side than the switch circuit 14, and the RF choke circuit 15 is provided closer to the voltage output terminal 16 side than the switch circuit 14. Therefore, a time constant of an RC delay circuit including the switch circuit 14 and the RF choke circuit 15 is not affected by the large-capacitance µF-class capacitors 12-1 and 12-2. Hereby, the above-described time constant of the RC delay circuit can be reduced, and as a result, an increase in speed of switching of the power source voltages can be achieved. In addition, in a case of applying the power source supply circuit 10 according to the embodiment as a gate bias circuit that supplies a gate voltage to a transistor, an increase in speed of switching of the gate voltages can be achieved, and thus an increase in speed of ON/OFF of the transistor can be achieved. In addition, the number of the switch circuits 14 may be one, and thus a circuit scale does not become large. As can be seen from the above discussion, the embodiment is capable of achieving a further increase in speed of ON/OFF of the transistor without increasing the circuit scale. Note that a principle from which the effect is obtained will be explained in more detail in a subsequent embodiment 2.

(2) Embodiment 2

Figure 2:
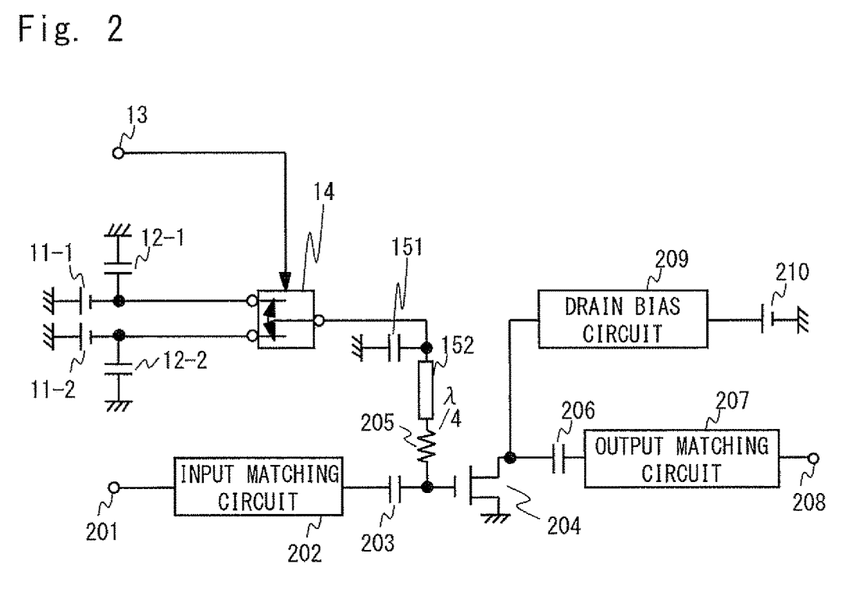
FIG. 2 is a diagram showing a configuration example of a high-frequency amplifier according to an embodiment 2.

The embodiment is an example in which the power source supply circuit 10 according to the embodiment 1 is applied to a high-frequency amplifier provided inside a communication device. In the high-frequency amplifier according to the embodiment, the power source supply circuit 10 according to the embodiment 1 is applied as a gate bias circuit that supplies a gate voltage to a gate terminal of an amplifying transistor (FET). In FIG. 2, a configuration example of the high-frequency amplifier according to the embodiment is shown. The high-frequency amplifier shown in FIG. 2 includes: a high-frequency signal input terminal 201; an input matching circuit 202; a capacitor 203; an amplifying transistor 204; a gate resistor 205; a capacitor 206; an output matching circuit 207; a high-frequency signal output terminal 208; a drain bias circuit 209; and a power source 210. In addition, in the high-frequency amplifier shown in FIG. 2, the power source supply circuit 10 according to the embodiment 1 is included as the gate bias circuit, and the voltage output terminal 16 of FIG. 1 is connected to the gate resistor 205 of the amplifying transistor 204. In the high-frequency amplifier shown in FIG. 2, the RF choke circuit 15 of FIG. 1 includes a $\lambda/4$ transmission line 152 connected in series between the switch circuit 14 and the voltage output terminal 16, and a high-frequency grounding capacitor 151 connected in parallel between the switch circuit 14 and the $\lambda/4$ transmission line 152. In addition, a switch changeover signal input terminal 13 is added thereto. Note that although in FIG. 2, the $\lambda/4$ transmission line 152 is used as a transmission line between the switch circuit 14 and the voltage output terminal 16, as the transmission line, the transmission line having a line length according to a wavelength of a signal amplified by the amplifying transistor 204 may be used. In addition, since as the RF choke circuit 15, an impedance seen from the voltage output terminal 16 side maybe a desired high impedance in a frequency band of a high-frequency signal, the line length of the transmission line is not necessarily $\lambda/4$ of a signal wavelength to be amplified. Hereinafter, a power source voltage generated by the power source 11-1 is referred to as a first gate voltage, and a power source voltage generated by the power source 11-2 is referred to as a second gate voltage. The first gate voltage is set as a voltage that should be applied to a gate terminal of the amplifying transistor 204, in a case where the high-frequency signal is output from the high-frequency signal output terminal 208 (in a case of ON). In addition, the second gate voltage is set as a voltage that should be applied to the gate terminal of the amplifying transistor 204, in a case where the high-frequency signal is not output from the high-frequency signal output terminal 208 (in a case of OFF). As one example, in a case where the amplifying transistor 204 is a depletion-type FET, both the first and the second gate voltages have negative polarities, and an absolute value of the second gate voltage is larger than the first gate voltage and a pinch-off voltage of the amplifying transistor 204. In addition, a power source voltage generated by the power source 210 is referred to as a drain voltage.

Hereinafter, there will be explained operation of the high-frequency amplifier according to the embodiment. First, there will be explained operation in the case where the high-frequency signal is output (in the case of ON). In this case, in the switch circuit 14, the output terminal is connected to the input terminal on the power source 11-1 side. Therefore, the first gate voltage generated by the power source 11-1 is applied to the gate terminal of the amplifying transistor 204 through the switch circuit 14, the $\lambda/4$ transmission line 152, and the gate resistor 205. Even if a gate current of the amplifying transistor 204 flows, the gate resistor 205 has a resistance value with which a voltage having dropped due to the gate resistor 205 can be almost ignored compared with the first gate voltage, and the resistance value is usually approximately several to several $10\Omega$.

Since the high-frequency signal is grounded to a GND by the high-frequency grounding capacitor 151 connected in parallel between the switch circuit 14 and the λ/4 transmission line 152, a phase of the high-frequency signal is rotated by the λ/4 transmission line 152. Therefore, the gate bias circuit seen from the gate terminal of the amplifying transistor 204 is seen to have a high impedance in the high frequency band of the high-frequency signal, and does not affect characteristics of the high-frequency signal. The drain voltage generated by the power source 210 is applied to a drain terminal of the amplifying transistor 204 through the drain bias circuit 209. Here, assume that the drain bias circuit 209 seen from the drain terminal of the amplifying transistor 204 is also seen to have a high impedance, and does not affect the characteristics of the high-frequency signal. In a state where the drain voltage and the first gate voltage are applied to the amplifying transistor 204 as described above, the high-frequency signal input from the high-frequency signal input terminal 201 is input to the amplifying transistor 204 through the input matching circuit 202 and the capacitor 203, is amplified by the amplifying transistor 204, and is subsequently output from the high-frequency signal output terminal 208 through the capacitor 206 and the output matching circuit 207.

Next, there will be explained operation in the case where the high-frequency signal is not output (in the case of OFF). In this case, in the switch circuit 14, the output terminal is connected to the input terminal on the power source 11-2 side. Therefore, the second gate voltage generated by the power source 11-2 is applied to the gate terminal of the amplifying transistor 204 similarly to the above-mentioned case of ON. At this time, the amplifying transistor 204 is pinched off, and thus does not amplify the high-frequency signal even if it is input. In addition, input itself of the high-frequency signal may not be performed in this case.

Next, there will be explained operation in a case where ON/OFF of the high-frequency signal is switched. Hereinafter, there will be mentioned the operation when the high-frequency signal is switched from an ON state to an OFF state, and vice versa. A switch changeover signal for switching a connection state of the switch circuit 14 from the ON state (a state where the output terminal of the switch circuit 14 is connected to the input terminal on the power source 11-1 side) to the OFF state (a state where the output terminal of the switch circuit 14 is connected to the input terminal on the power source 11-2 side) is input from the switch changeover signal input terminal 13 to the switch circuit 14. In the switch circuit 14, the connection destination of the output terminal is then switched to the input terminal on the power source 11-2 side. Hereby, a voltage of the output terminal of the switch circuit 14 is switched from the first gate voltage to the second gate voltage.

Figure 3:
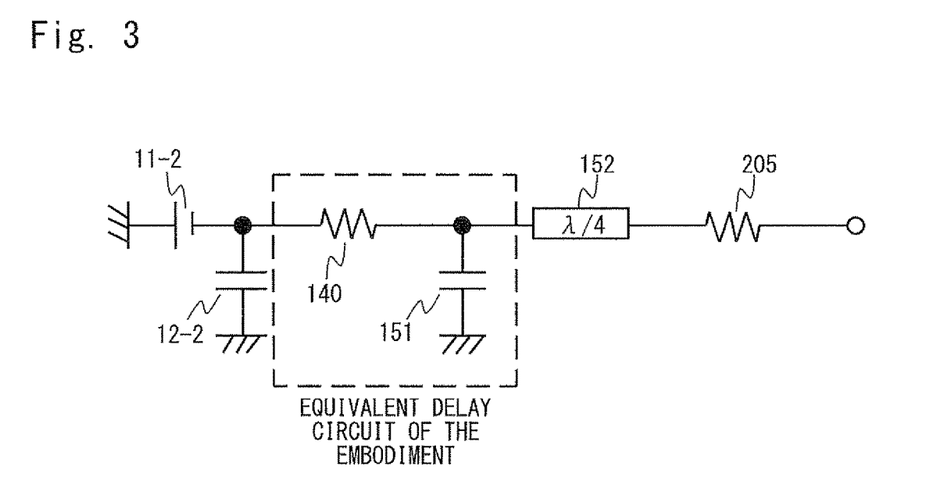
FIG. 3 is a diagram showing an example of an equivalent circuit of a gate bias circuit in the high-frequency amplifier according to the embodiment 2.

An equivalent circuit of the gate bias circuit at this time is shown in FIG. 3. Since in the embodiment, the µF-class capacitor 12-2 is provided closer to the power source 11-2 side than the switch circuit 14, the equivalent circuit is configured as shown in FIG. 3. At this time, a gate voltage of the amplifying transistor 204 is also switched from the first gate voltage to the second gate voltage. In a transient response when the gate voltage is switched, it takes time for the gate voltage to be switched, under the influence of an RC delay circuit including a contact resistor of the switch circuit 14 and a parasitic resistor (it is represented by a reference numeral 140 in FIG. 3) of a gate wire, and the high-frequency grounding capacitor 151, or under the influence of a supply capability or a discharge capability of an inrush (instantaneous) current from the power source that supplies the gate voltage. Here, the contact resistor of the switch circuit 14 and the parasitic resistor of the gate wire are equivalently estimated to be approximately 1Ω in consideration of the supply capability, the discharge capability, etc. of the instantaneous current of the power source. In the embodiment, when a frequency of the high-frequency signal becomes not less than hundreds of MHz, a capacitance of the high-frequency grounding capacitor 151 for grounding the high-frequency signal is approximately 1 to 100 pF, and thus a time constant of the RC delay circuit results in: R*C=approximately several ps to 0.1 ns.

Figure 4:
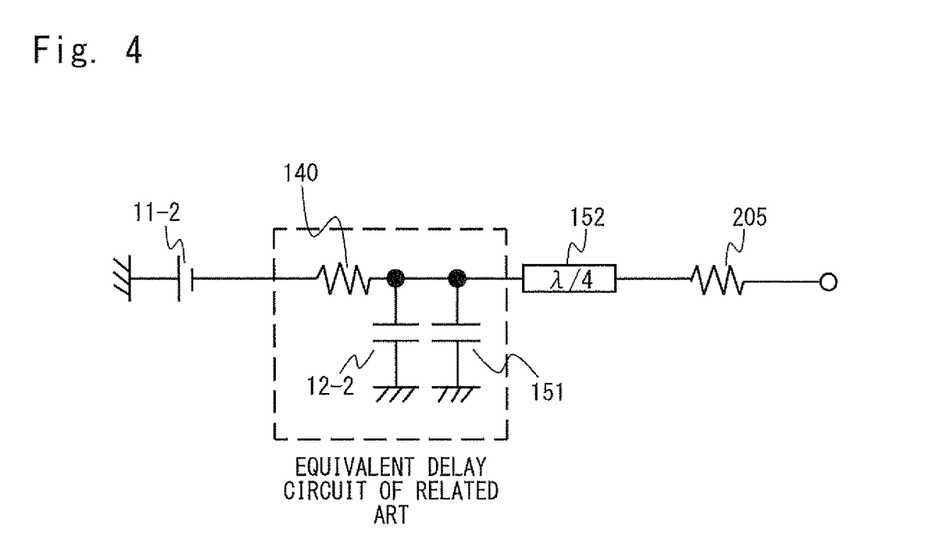
FIG. 4 is a diagram showing an example of an equivalent circuit of a gate bias circuit in a high-frequency amplifier according to a related art.

Here, the related art is considered that has a configuration in which the µF-class capacitor 12-2 is provided closer to the amplifying transistor 204 (the voltage output terminal 16) side than the switch circuit 14. An equivalent circuit of a gate bias circuit of the related art is shown in FIG. 4. In a transient response when the gate voltage is switched, the gate voltage is switched late by a time constant of the RC delay circuit, under the influence of an RC delay circuit including the contact resistor of the switch circuit 14 and the parasitic resistor (it is represented by the reference numeral 140 in FIG. 4) of the gate wire, and the µF-class capacitor 12-2 and the high-frequency grounding capacitor 151. At this time, since the µF-class capacitor 12-2 has a large capacitance of approximately 0.1 to 50 µF, the time constant of the RC delay circuit is not less than 1 µs, and may be approximately 100 µs in some cases.

Figure 5:
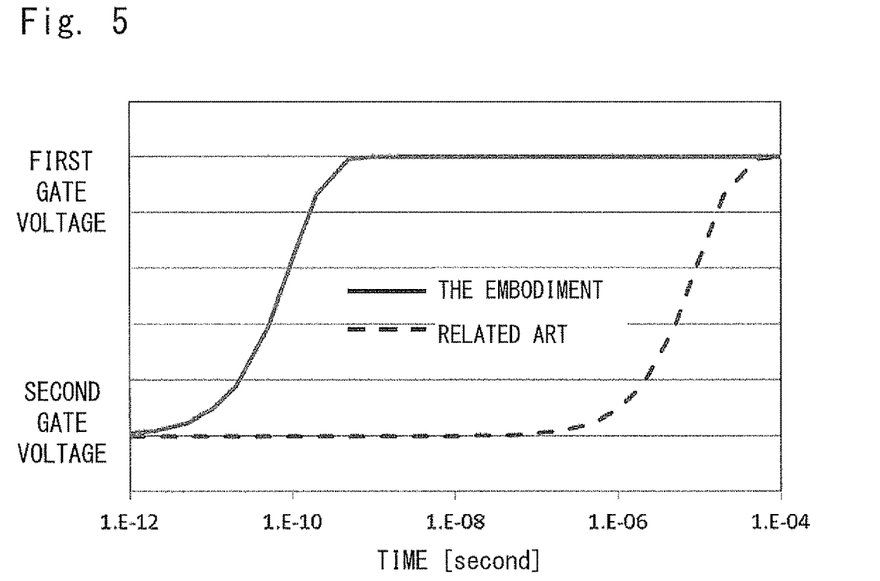
FIG. 5 is a graph showing an example of switching times from second gate voltages to first gate voltages in the high-frequency amplifiers according to the embodiment 2 and the related art.
Figure 6:
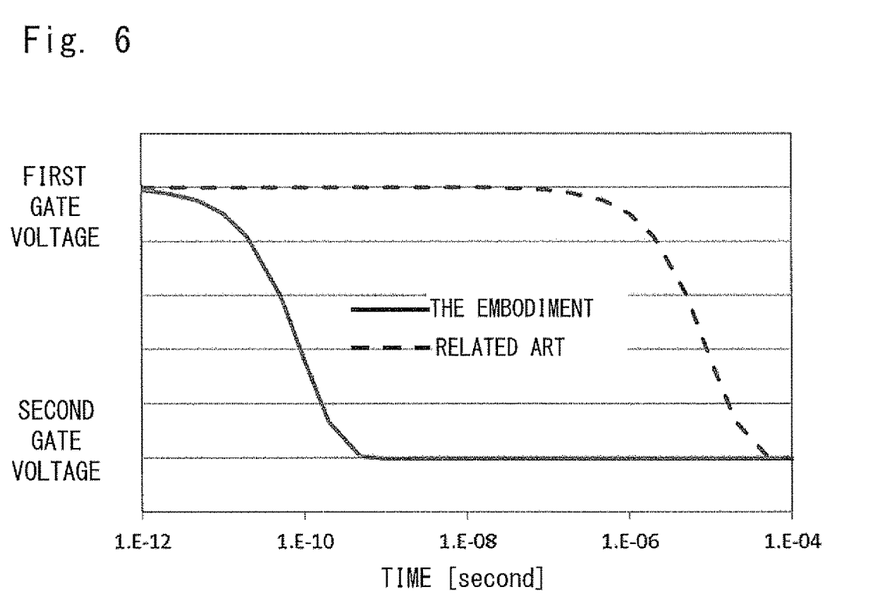
FIG. 6 is a graph showing an example of switching times from the first gate voltages to the second gate voltages in the high-frequency amplifiers according to the embodiment 2 and the related art.

As described above, since in the embodiment, the µF-class capacitors 12-1 and 12-2 are provided closer to the power sources 11-1 and 11-2 sides than the switch circuit 14, a switching speed of the gate voltages of the amplifying transistor 204 can be increased as mentioned above. In FIG. 5, there is shown a switching time from the second gate voltage to the first gate voltage. In FIG. 6, there is shown a switching time from the first gate voltage to the second gate voltage. As is understood from FIGS. 5 and 6, in the embodiment, the switching time of the gate voltages can be shortened almost to a $1/10^5$ time compared with the related art.

Here, as reasons that can achieve shortening of the switching time of the gate voltages by the configuration of the embodiment, further supplementally, a reason is included that operation of high-speed charge and discharge of the large-capacitance µF-class capacitors 12-1 and 12-2 is not used, the capacitors 12-1 and 12-2 having large time constants and requiring time. Charges that move through the switch circuit 14 are charges for charging and discharging the high-frequency grounding capacitor 151 (a capacitance thereof is approximately 1 to 100 pF) for RF decoupling.

The capacitance of the high-frequency grounding capacitor 151 is smaller by not less than a single digit, compared with the µF-class capacitors 12-1 and 12-2 for video band decoupling. In the configuration of the embodiment, the large-capacitance µF-class capacitors 12-1 and 12-2 are always charged near desired potentials, regardless of a state of the switch circuit 14 arranged ahead of the capacitors 12-1 and 12-2. Therefore, the potentials of the µF-class capacitors 12-1 and 12-2 are fluctuated by the movement of the charges in connection with charge and discharge due to the gate current (the current is small) to the high-frequency grounding capacitor 151 and the amplifying transistor, the charge and discharge being slightly performed. However, in a case where, for example, capacitances different from the capacitance of the high-frequency grounding capacitor 151 by two digits are used as the capacitances of the µF-class capacitors 12-1 and 12-2, fluctuations of the potentials also become an order of approximately 1/100, and thus an effect of the fluctuations of the potentials is extremely small, and can be almost ignored. An amount of charges required to charge and discharge to a desired potential the high-frequency grounding capacitor 151 for RF decoupling and the gate terminal of the amplifying transistor 204 ahead of the high-frequency grounding capacitor 151 may just be extremely smaller, the charges passing through the switch circuit 14, compared with charges for charging and discharging the µF-class capacitors 12-1 and 12-2 to desired potentials. Furthermore, since the large-capacitance µF-class capacitors 12-1 and 12-2 are mainly used for video band decoupling, they are arranged in the vicinity of the amplifying transistor 204 or the switch circuit 14 in order to exhibit an effect of the video band decoupling, and thus it can be expected that a wire length of connection between the circuits can be reduced. For these reasons, even if a resistance is generated in the switch circuit 14 or the gate wire, deterioration of the time constant or an effect due to the resistance is small. Further, since it is also possible to perform RF decoupling or video band decoupling, or to relax the time constant to approximate required magnitude of the gate resistor 205, inexpensive parts and circuit configurations can be applied.

As mentioned above, in the embodiment, in the gate bias circuit, the µF-class capacitors 12-1 and 12-2 are provided closer to the power sources 11-1 and 11-2 sides than the switch circuit 14, and the high-frequency grounding capacitor 151 is provided closer to the amplifying transistor 204 side than the switch circuit 14. Therefore, since increase in speed of switching of the gate voltages can be achieved, increase in speed of ON/OFF of the transistor can be achieved. In addition, since the number of the switch circuits 14 may also be one, and the time constant can be relaxed, the circuit scale does not become large. From the discussion described above, there is obtained an effect capable of achieving further increase in speed of ON/OFF of the transistor without increasing the circuit scale.

Note that in the embodiment, as shown in FIG. 2, the switch circuit 14 is provided not on the drain terminal side of the amplifying transistor 204, but on the gate terminal side thereof. The reason is that a resistance of the switch circuit 14 can be realized to be approximately several 100 mmΩ compared with several to tens of Ω of the gate resistor 205. In addition, this is because if the gate bias circuit has a configuration in which the gate resistor 205 is originally present even when seen from the gate terminal of the amplifying transistor 204, the resistance is not increased even though the switch circuit 14 is provided. In addition, this is because even if the gate bias circuit has a configuration without the gate resistor 205, an increased amount of the resistance by the switch circuit 14 being provided is small, and thus there is almost no effect of providing the switch circuit 14. In addition, this is because decoupling of a video band can still be performed by the gate bias circuit in the vicinity of the amplifying transistor 204, through the gate resistor 205 (it hardly depends on a frequency, and acts as a resistance) and the RF choke circuit 15 (a direct current passes through the RF choke circuit 15 almost without a resistance, and further an impedance in the video band is small). In addition, this is because since the resistance of the switch circuit 14 is as small as approximately several 100 mmΩ, it is considered that there is almost no effect of providing the switch circuit 14.

(3) Embodiment 3

Figure 7:
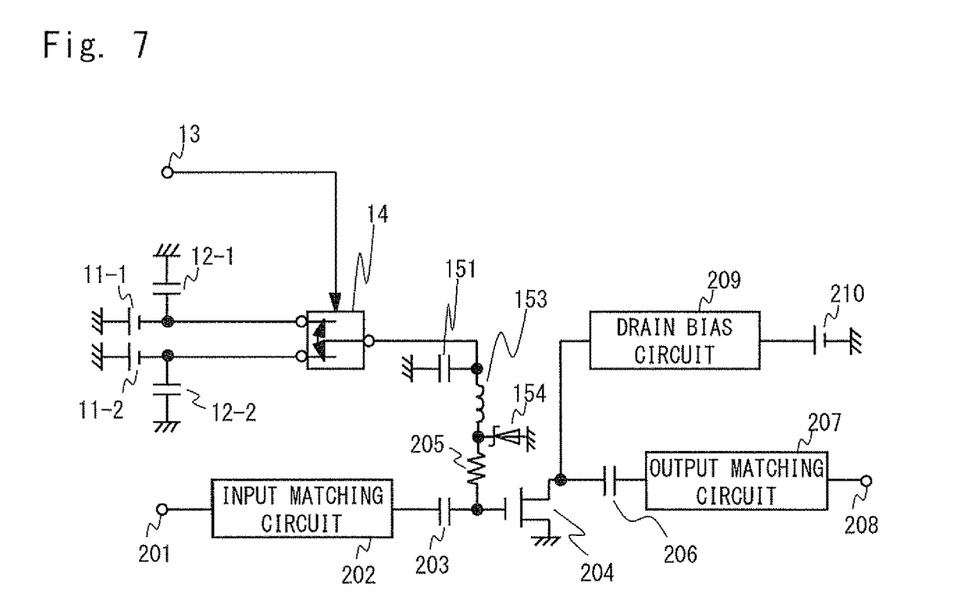
FIG. 7 is a diagram showing a configuration example of a high-frequency amplifier according to an embodiment 3.

The embodiment is an example in which a configuration of the RF choke circuit 15 of the embodiment 2 is changed. In FIG. 7, there is shown a configuration example of a high-frequency amplifier according to the embodiment. The high-frequency amplifier shown in FIG. 7 differs in that a choke coil 153 is provided instead of the λ/4 transmission line 152, compared with the embodiment 2. That is to say, in the embodiment 2, the RF choke circuit 15 includes the high-frequency grounding capacitor 151 and the λ/4 transmission line 152, while in the embodiment, the RF choke circuit 15 includes the high-frequency grounding capacitor 151 and the choke coil 153. In this case, an electromotive force is generated at the time of switching of the gate voltages, and thereby a high voltage might be applied to the gate terminal of the amplifying transistor 204. In order to avoid it, a voltage limiting element 154 is arranged in parallel between the choke coil 153 and the gate resistor 205 (the voltage output terminal 16). It is considered to use a Zener diode, an anti-parallel diode, etc. as the voltage limiting element 154. The voltage limiting element 154 can appropriately select a polarity or a voltage limiting value according to a voltage value or a polarity of a voltage desired to be limited. In addition, the voltage limiting element 154 may be connected in parallel with the choke coil 153, and thereby an undesirable voltage can be prevented from being applied to the gate terminal of the amplifying transistor 204.

(4) Embodiment 4

Figure 8:
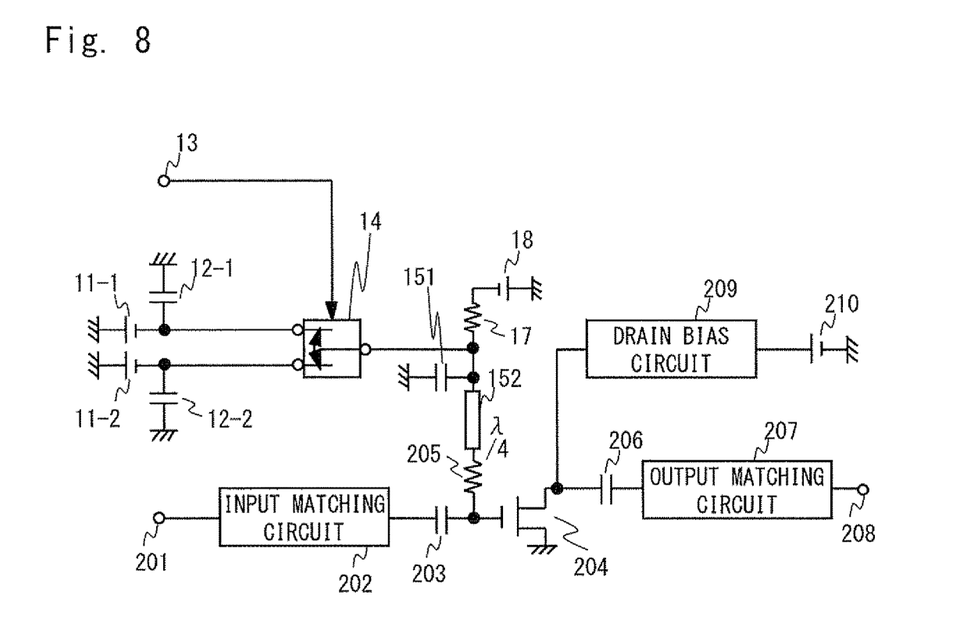
FIG. 8 is a diagram showing a configuration example of a high-frequency amplifier according to an embodiment 4.

In FIG. 8, there is shown a configuration example of a high-frequency amplifier according to the embodiment. The high-frequency amplifier shown in FIG. 8 differs in that a protective resistor 17 whose one end is connected to the output terminal of the switch circuit 14, and a power source (a second power source) 18 connected to the other end of the protective resistor 17 are added, compared with the embodiment 2. Hereinafter, a power source voltage generated by the power source 18 is referred to as a third gate voltage. When the connection state of the switch circuit 14 is switched, the switch circuit 14 is in a state where the output terminal is connected to neither of the two input terminals. At this time, the gate voltage of the amplifying transistor 204 becomes unfixed, and thereby the amplifying transistor 204 may break down in some cases. In order to avoid it, the power source 18 is connected to the gate terminal of the amplifying transistor 204 through the protective resistor 17, and the third gate voltage is applied. Hereby, the gate voltage of the amplifying transistor 204 can be avoided from being unfixed. Note that the third gate voltage may be the same voltage as the first gate voltage or the second gate voltage, or may be a different one therefrom. In a case of setting the third gate voltage to be the different voltage, the third gate voltage may be within a range of voltages between the first gate voltage and the second gate voltage, or may be out of the range.

(5) Embodiment 5

Figure 9:
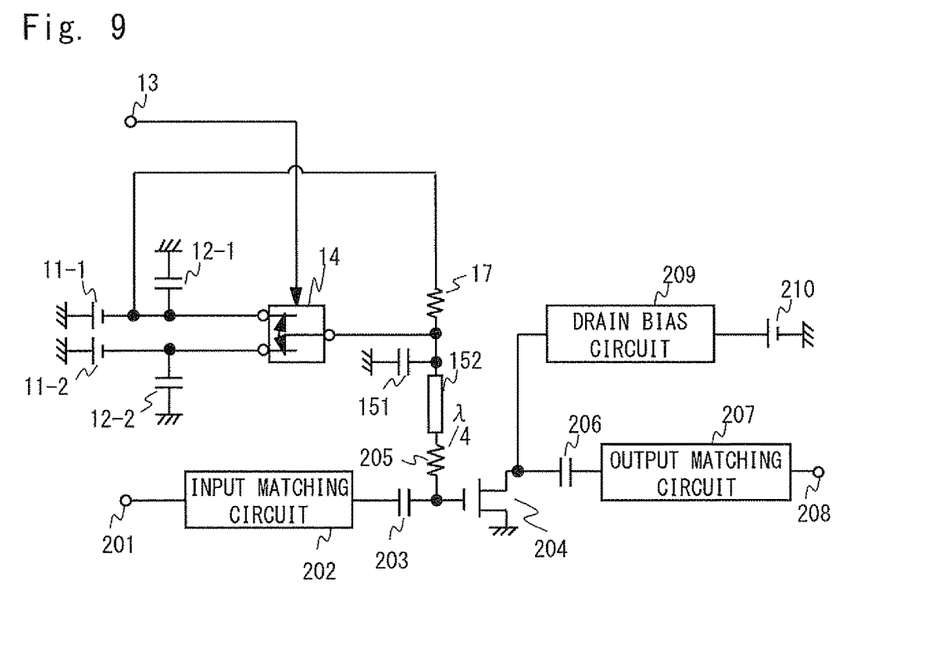
FIG. 9 is a diagram showing a configuration example of a high-frequency amplifier according to an embodiment 5.

The embodiment is an example in which the third gate voltage of the embodiment 4 is supplied from the power source 11-1 as well as the first gate voltage. In FIG. 9, there is shown a configuration example of a high-frequency amplifier according to the embodiment. The high-frequency amplifier shown in FIG. 9 differs in that the other end of the protective resistor 17 is connected to the power source 11-1, and that the power source 18 is removed, compared with the embodiment 4. As described above, the third gate voltage is supplied from the power source 11-1 as well as the first gate voltage, and thereby the number of power sources can be reduced. Note that although the embodiment is the example in which the third gate voltage is supplied from the power source 11-1, the third gate voltage can be supplied also from the power source 11-2.

(6) Embodiment 6

Figure 10:
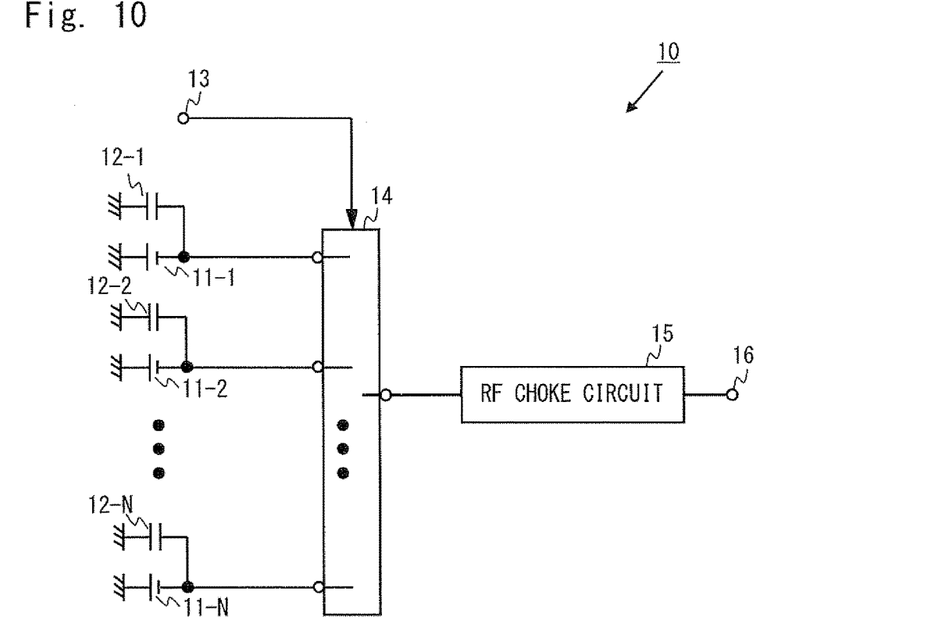
FIG. 10 is a diagram showing a configuration example of a power source supply circuit according to an embodiment 6.

In the embodiment 1, there are provided the two power sources 11-1 and 11-2 having power source voltages different from each other. In contrast with this, the embodiment is an example of providing N (N is a natural number not less than 3) power source voltages different from each other. In FIG. 10, there is shown a configuration example of the power source supply circuit 10 according to the embodiment. The power source supply circuit 10 shown in FIG. 10 differs in that the N power sources 11-1 to 11-N are provided, and that the N μF-class capacitors 12-1 to 12-N are provided, compared with the embodiment 1. The switch circuit 14 is a switch with a ratio of N:1 to which power source voltages generated by the power sources 11-1 to 11-N are input, and that switches and outputs these power source voltages according to a switch changeover signal from the switch changeover signal input terminal 13. Although the number of input terminals of the switch circuit 14 is N, configurations and operation of the switch circuit 14 other than this are similar to those of the embodiment 1. The μF-class capacitors 12-1 to 12-N are provided corresponding to the N power sources 11-1 to 11-N, and are connected in parallel between the corresponding power sources and the switch circuit 14.

(7) Embodiment 7

Figure 11:
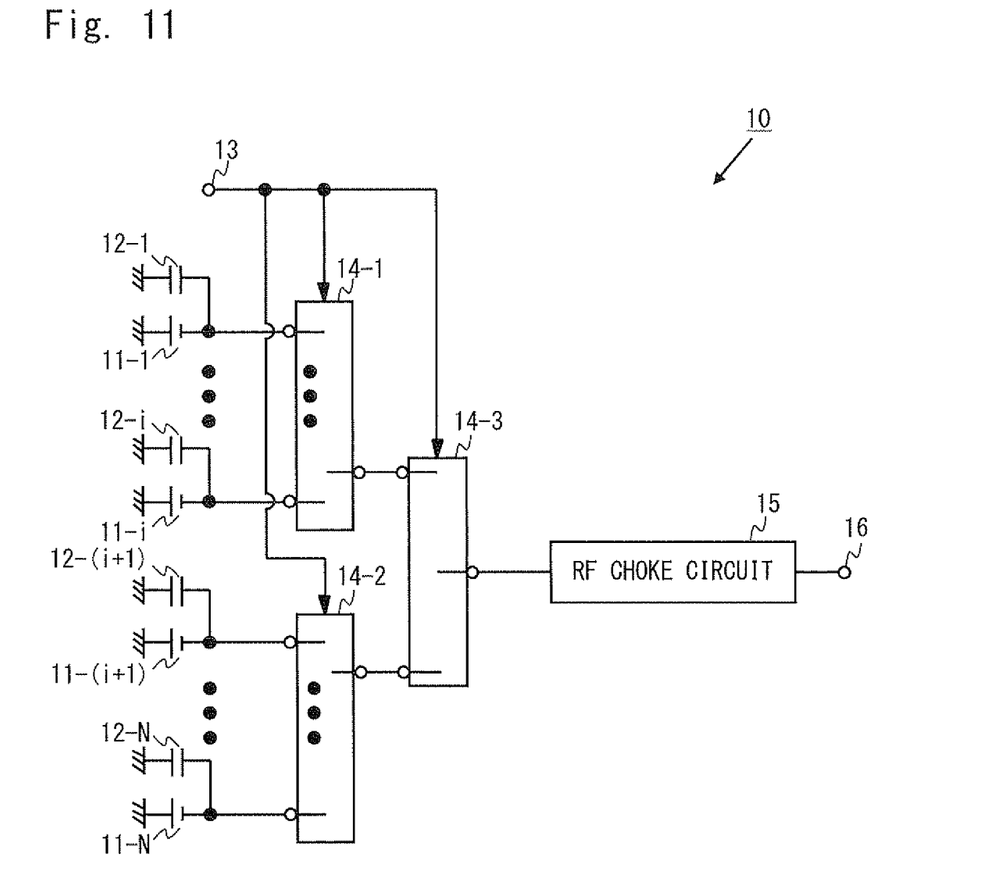
FIG. 11 is a diagram showing a configuration example of a power source supply circuit according to an embodiment 7.

The embodiment is an example in which the switch circuit 14 of the embodiment 6 includes a plurality of switch elements. In FIG. 11, there is shown a configuration example of the power source supply circuit 10 according to the embodiment. The power source supply circuit 10 shown in FIG. 11 differs in that the switch circuit 14 includes three switch elements 14-1 to 14-3, compared with the embodiment 6. Note that FIG. 11 is the example in which N is not less than 4.

The power sources 11-1 to 11-N are grouped into a plurality of groups based on power source voltages generated by them. Here, assume that the power sources 11-1 to 11-N are grouped so that the power sources that generate power source voltages close to each other may mutually belong to the same groups. As a result, assume that the power sources 11-1 to 11-N are grouped into two of a group (hereinafter referred to as a group #1) including i power sources 11-1 to 11-i (i is a natural number not less than 2 and less than N), and a group (hereinafter referred to as a group #2) including (N−i) power sources 11-(i+1) to 11-N. The switch element (a first switch element) 14-1 is provided corresponding to the group #1, power source voltages generated by the power sources 11-1 to 11-i belonging to the corresponding group #1 are input to the switch element 14-1, and the switch element 14-1 switches and outputs these power source voltages according to a switch changeover signal. The switch element (the first switch element) 14-2 is provided corresponding to the group #2, power source voltages generated by the power sources 11-(i+1) to 11-N belonging to the corresponding group #2 are input to the switch element 14-2, and the switch element 14-2 switches and outputs these power source voltages according to a switch changeover signal. The power source voltages output from the switch elements 14-1 and 14-2 are input to the switch element (a second switch element) 14-3, and the switch element 14-3 switches and outputs these power source voltages according to a switch changeover signal. Note that although in the switch elements 14-1 to 14-3, the number of input terminals is the number according to the input power source voltages (i in the switch element 14-1, (N−i) in the switch element 14-2, and two in the switch element 14-3), configurations and operation of the switch elements 14-1 to 14-3 other than this are similar to those of the switch circuit 14 of the embodiment 1.

Although the power sources 11-1 to 11-N are grouped into two in the embodiment, they may be grouped into three or more. That is to say, the number of groups may just be set to be M (M is a natural number not less than 2 and not more than N/2). In this case, the first switch element may just be provided corresponding to each of three or more groups, and the second switch element may just be provided in a stage subsequent to the first switch element. Here, since the switch circuit includes the plurality of switch elements in the embodiment, the circuit scale becomes large. However, as explained in the embodiment 2, since the switching time of the gate voltages can be shortened almost to the $1/10^5$ time compared with the related art, such an effect that can sufficiently compensate for increase in circuit scale can be obtained.

(8) Embodiment 8

Figure 12:
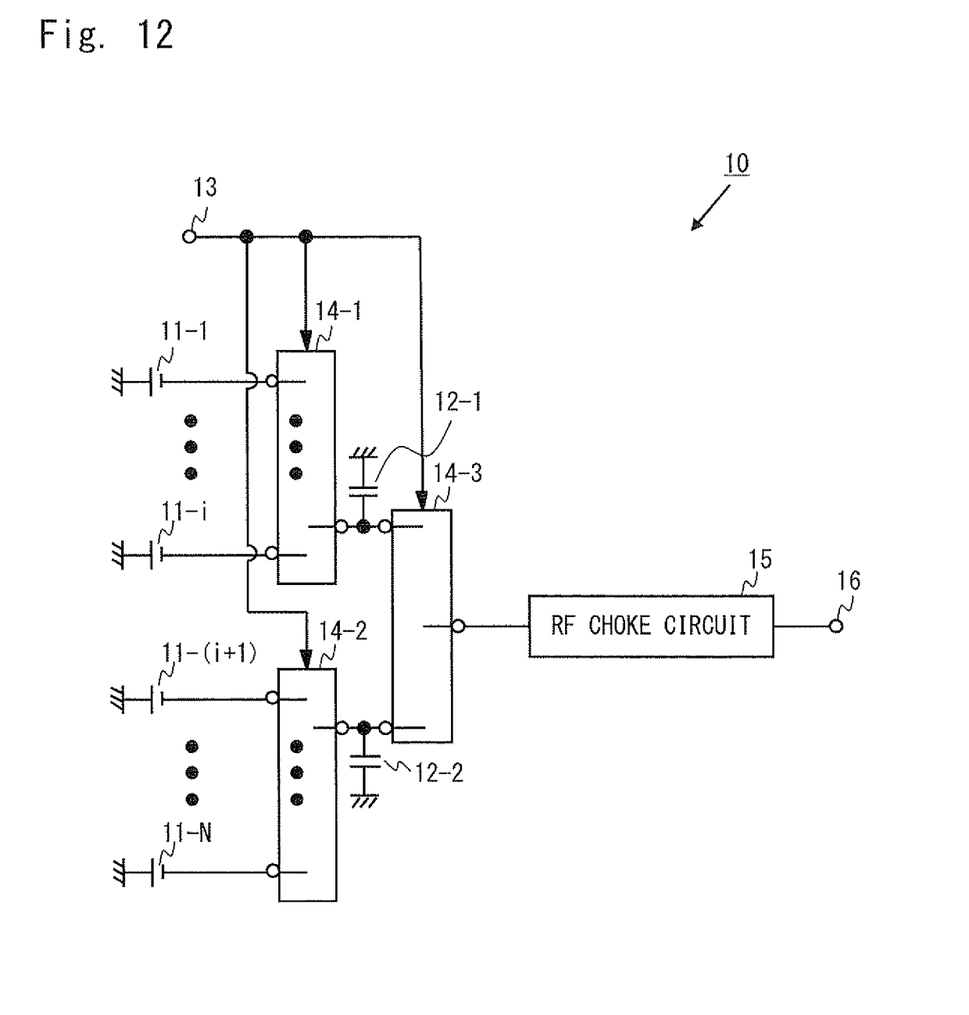
FIG. 12 is a diagram showing a configuration example of a power source supply circuit according to an embodiment 8.

In the embodiment 7, the N μF-class capacitors 12-1 to 12-N are provided corresponding to the N power sources 11-1 to 11-N. In contrast with this, the embodiment is an example in which the number of μF-class capacitors is reduced. In FIG. 12, there is shown a configuration example of the power source supply circuit 10 according to the embodiment. The power source supply circuit 10 shown in FIG. 12 differs in that only the two μF-class capacitors 12-1 and 12-2 are provided, compared with the embodiment 7. The μF-class capacitor 12-1 is provided corresponding to the switch element 14-1, and is connected in parallel between the corresponding switch element 14-1 and the switch element 14-3. In addition, the μF-class capacitor 12-2 is provided corresponding to the switch element 14-2, and is connected in parallel between the corresponding switch element 14-2 and the switch element 14-3. In this case, delay due to an RC delay circuit can cause a problem, the RC delay circuit including a contact resistor and a wiring resistor of the switch element 14-1, and the μF-class capacitor 12-1. However, since in the embodiment, the power sources 11-1 to 11-i mutually belong to the same group, and the power source voltages generated by them are close to each other, an effect of the delay due to the RC delay circuit is small.

Although the power sources 11-1 to 11-N are grouped into two in the embodiment, they may be grouped into three or more. In this case, the first switch element may just be provided corresponding to each of the three or more groups, and the μF-class capacitor may just be provided corresponding to each of the first switch elements.

(9) Embodiment 9

Figure 13:
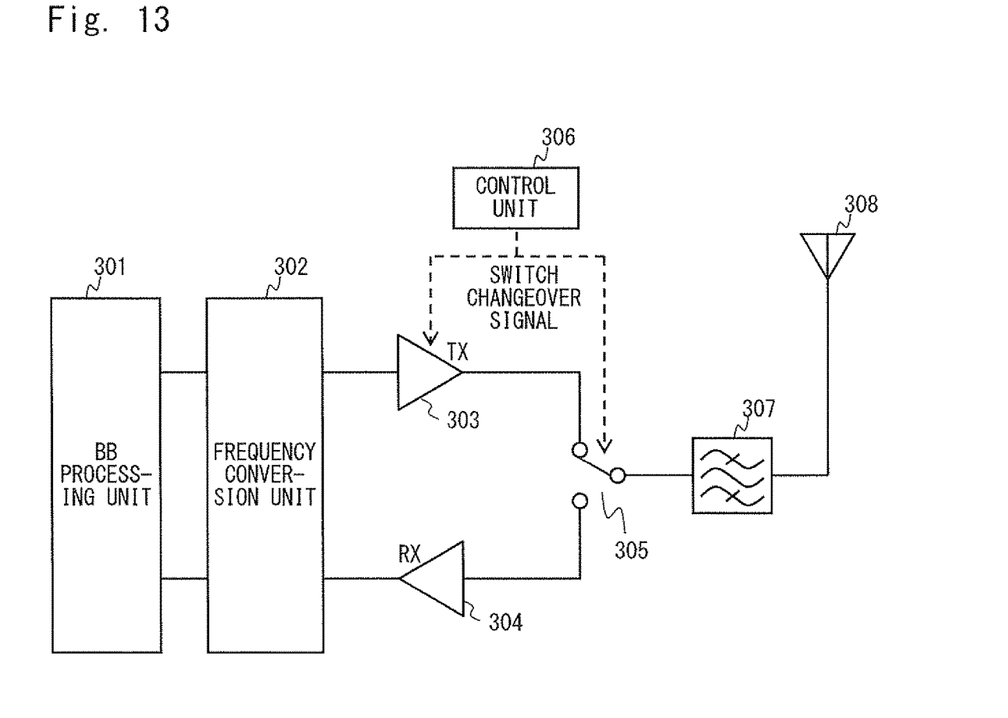
FIG. 13 is a diagram showing a configuration example of a base station according to an embodiment 9.

The embodiment is an example in which the high-frequency amplifier according to the embodiments 2 to 5 is applied to a base station. The base station according to the embodiment is a base station of a TDD scheme, and the high-frequency amplifier according to the embodiments 2 to 5 is applied as a transmission amplifier (TX). In FIG. 13, there is shown a configuration example of the base station according to the embodiment. The base station shown in FIG. 2 includes: a BB (Base Band) processing unit 301; a frequency conversion unit 302; a transmission amplifier (TX) 303; a receiving amplifier (RX) 304; a TX/RX changeover switch 305; a control unit 306; a BPF (Band Pass Filter) 307; and an antenna 308. Note that when the high-frequency amplifier according to the embodiments 2 to 5 is applied to the transmission amplifier (TX) 303, the high-frequency signal input terminal 201 is connected to the frequency conversion unit 302, the high-frequency signal output terminal 208 is connected to the TX/RX changeover switch 305, and the switch changeover signal input terminal 13 is connected to the control unit 306.

The control unit 306 outputs a switch changeover signal to the TX/RX changeover switch 305 and the transmission amplifier (TX) 303, and switches transmission/reception. The TX/RX changeover switch 305 is connected to the transmission amplifier (TX) 303 at the time of transmission, and is connected to the receiving amplifier (RX) 304 at the time of reception. At the time of transmission, the transmission amplifier 303 is turned on by the switch changeover signal from the control unit 306, a transmission signal is generated as a base band signal by the BB processing unit 301, a frequency of the transmission signal signal is converted from an IF (Intermediate Frequency) band into an RF band by the frequency conversion unit 302, the transmission signal signal is amplified by the transmission amplifier (TX) 303, an unnecessary frequency component of the amplified transmission signal signal is suppressed by the bandpass filter 307, and subsequently the transmission signal signal is transmitted from the antenna 308. At the time of reception, the transmission amplifier (TX) 303 is turned off by the switch changeover signal from the control unit 306, thereby an unnecessary signal and noise are prevented from sneaking in a reception side from the transmission amplifier (TX) 303 or being output from the antenna 308, and a reception signal is received by the antenna 308, an unnecessary frequency component of the reception signal is suppressed in the bandpass filter 307, the reception signal is amplified by the reception amplifier (RX) 304, a frequency of the reception signal is converted from the RF band into the IF band by the frequency conversion unit 302, and subsequently the reception signal is processed as the base band signal by the BB processing unit 301.

Note that although in the embodiment, the high-frequency amplifier according to the embodiments 2 to 5 is applied only to the transmission amplifier (TX) 303, it may be applied to both the transmission amplifier (TX) 303 and the receiving amplifier (RX) 304.

Hereinbefore, although the invention in the present application has been explained with reference to the embodiments, it is not limited by the above. Various changes that can be understood by those skilled in the art can be made to configurations and details of the invention in the present application within the scope of the invention.

For example, although in the above-described embodiments, there have been explained the examples of applying the power source supply circuit 10 to the high-frequency amplifier, the power source supply circuit 10 may be applied to an electronic circuit for high frequency (for example, a voltage variable-type microwave oscillator or a changeover switch circuit of a high-frequency signal) that discretely switches and uses a plurality of power source voltages. Further, although the case has been explained where the high-frequency grounding capacitor includes a lumped constant circuit, the high-frequency grounding capacitor may include distributed constant lines, such as an open stub, or a combination thereof. In addition, in the above-described embodiments, there have been explained the examples of setting the amplifying transistor 204 as the FET. The FET may be more desirably a compound semiconductor FET having a comparatively small gate capacitance than an Si-MOS (Metal Oxide Semiconductor) type FET having a large gate capacitance of the transistor. However, the amplifying transistor 204 is not limited to the FET, and may be a bipolar-type transistor. In that case, the present invention may just be applied by appropriately replacing a corresponding component name, such as replacing a gate with a base.

In addition, although in the above-described embodiments, there have been explained the examples of setting the polarity of the power source to be negative, assuming that the amplifying transistor 204 is the depletion-type FET, the polarity of the power source and the power source voltage may just be appropriately selected according to an element to be used or a bias voltage whose ON/OFF is set. In addition, in the above-described embodiments, there have been explained the examples of the high-frequency amplifier provided inside the communication device. The high-frequency amplifier may be provided in a transmission system inside the communication device in order to amplify a high-frequency transmission signal, or may be provided in a reception system thereinside in order to amplify a high-frequency reception signal.

This application claims priority based on Japanese Patent Application No. 2015-022141 filed on Feb. 6, 2015, and the entire disclosure thereof is incorporated herein.

REFERENCE SIGNS LIST 11-1 to 11-N power source
12-1 to 12-N µF-class capacitor
13 switch changeover signal input terminal
14 switch circuit
14-1 to 14-3 switch element
15 RF choke circuit
151 high-frequency grounding capacitor
152 λ/4 transmission line
153 choke coil
154 voltage limiting element (protecting diode)
16 voltage output terminal
17 protective resistor
18 power source
201 high-frequency signal input terminal
202 input matching circuit
203 capacitor
204 amplifying transistor
205 gate resistor
206 capacitor
207 output matching circuit
208 high-frequency signal output terminal
209 drain bias circuit
210 power source
301 BB (Base Band) processing unit
302 frequency conversion unit
303 transmission amplifier
304 receiving amplifier
305 TX/RX changeover switch
306 control unit
307 bandpass filter
308 antenna

What is claimed is:
1. A power source supply circuit comprising:
a plurality of first power sources that generate power source voltages different from each other;
a switch circuit that switches and outputs the power source voltages generated by the plurality of first power sources;
a voltage output terminal that outputs outside the power source voltages output from the switch circuit;
an RF (Radio Frequency) choke circuit provided between the switch circuit and the voltage output terminal, the RF choke circuit including a first capacitor; and a second capacitor provided between the plurality of first power sources and the switch circuit, the second capacitor having a larger capacitance than that of the first capacitor.

2. The power source supply circuit according to claim 1, wherein the RF choke circuit includes a choke coil connected in series between the switch circuit and the voltage output terminal, and the first capacitor connected in parallel between the switch circuit and the choke coil.

3. The power source supply circuit according to claim 2, wherein the RF choke circuit further includes a voltage limiting element connected in parallel between the choke coil and the voltage output terminal.

4. An amplifier comprising the power source supply circuit according to claim 1, further comprising an amplifying transistor that operates by the power source voltage output from the voltage output terminal of the power source supply circuit.

5. A communication device comprising the amplifier according to claim 4, wherein the amplifying transistor amplifies a transmission signal or a reception signal.

6. The communication device according to claim 5, wherein the RF choke circuit includes: a transmission line connected in series between the switch circuit and the voltage output terminal, the transmission line having a line length according to a wavelength of a transmission signal or a reception signal that is amplified by the amplifying transistor; and the first capacitor connected in parallel between the switch circuit and the transmission line.

7. The communication device according to claim 5, further comprising:
a protective resistor whose one end is connected to an output terminal of the switch circuit; and
a second power source that is connected to the other end of the protective resistor.

8. The communication device according to claim 5, further comprising a protective resistor whose one end is connected to an output terminal of the switch circuit, and whose other end is connected to one of the plurality of first power sources.

9. The communication device according to claim 5, wherein
the plurality of first power sources are grouped into a plurality of groups, and
the switch circuit includes a plurality of first switch elements that are provided so as to respectively correspond to the plurality of groups, and switch and output power source voltages generated by the first power sources belonging to the corresponding groups, and a second switch element that switches and outputs the power source voltages output from the plurality of first switch elements.

10. The communication device according to claim 9, wherein the plurality of first power sources are grouped according to the power source voltages respectively generated by the plurality of first power sources.

11. The communication device according to claim 9, wherein a plurality of the second capacitors are provided corresponding to each of the plurality of first switch elements, and are connected in parallel between the corresponding first switch elements and the second switch element.

12. The communication device according to claim 5, wherein a plurality of the second capacitors are provided to respectively correspond to the plurality of first power sources, and are connected in parallel between the corresponding first power sources and the switch circuit.

13. The communication device according to claim 5, wherein one of the plurality of first power sources generates a power source voltage to pinch off the amplifying transistor.

14. A base station of a TDD (Time Domain Duplexing) scheme, comprising:
a plurality of first power sources that generate power source voltages different from each other;
a switch circuit that switches and outputs the power source voltages generated by the plurality of first power sources;
an RF choke circuit that includes a first capacitor connected to an output terminal of the switch circuit;
a second capacitor provided between the plurality of first power sources and the switch circuit, the second capacitor having a larger capacitance than the first capacitor; and
an amplifying transistor that operates by a power source voltage output from the RF choke circuit,
wherein at the time of transmission, the base station amplifies a signal by the amplifying transistor, and transmits the amplified signal.

15. A power source supply method comprising:
generating power source voltages different from each other by a plurality of first power sources;
switching by a switch circuit the power source voltages generated by the plurality of first power sources, and outputting them outside from a voltage output terminal;
providing an RF choke circuit between the switch circuit and the voltage output terminal, the RF choke circuit including a first capacitor; and
providing a second capacitor between the plurality of first power sources and the switch circuit, the second capacitor having a larger capacitance than the first capacitor.

* * * * *